US011159171B1

(12) United States Patent
Huang

(10) Patent No.: US 11,159,171 B1
(45) Date of Patent: Oct. 26, 2021

(54) DIGITAL SLOPE ANALOG TO DIGITAL CONVERTER DEVICE AND SIGNAL CONVERSION METHOD

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/150,303

(22) Filed: Jan. 15, 2021

(30) Foreign Application Priority Data

Apr. 16, 2020 (TW) .................. 109112861

(51) Int. Cl.
*H03M 1/34* (2006.01)
(52) U.S. Cl.
CPC ..................... *H03M 1/34* (2013.01)
(58) Field of Classification Search
CPC ................. H03M 1/34; H03M 1/56
USPC ................. 341/157–158, 169, 172
See application file for complete search history.

(56) References Cited

U.S. PATENT DOCUMENTS

| 8,368,578 | B2 * | 2/2013 | Harpe | ................... H03M 1/56 341/172 |
| 8,912,942 | B2 | 12/2014 | Lin et al. | |
| 9,847,790 | B2 * | 12/2017 | Liu | ................... H03M 1/38 |
| 2016/0336954 | A1 | 11/2016 | Tsai | |

FOREIGN PATENT DOCUMENTS

WO WO2017058874 A1 4/2017

OTHER PUBLICATIONS

P. Harpe, E. Cantatore and A. van Roermund, "A 10b/12b 40 kS/s SAR ADC With Data-Driven Noise Reduction Achieving up to 10.1b ENOB at 2.2fJ/Conversion-Step", IEEE Journal of Solid-State Circuits (vol. 48, Issue: 12, Dec. 2013).
L. Chen, X. Tang, A. Sanyal, Y. Yoon, J. Cong and N. Sun, "A 0.7-V 0.6-µW 100-kS/s Low-Power SAR ADC With Statistical Estimation-Based Noise reduction", IEEE Journal of Solid-State Circuits (vol. 52, Issue: 5, May 2017).

(Continued)

*Primary Examiner* — Khai M Nguyen
(74) *Attorney, Agent, or Firm* — WPAT, PC

(57) ABSTRACT

A digital slope analog to digital converter device includes a capacitor array circuit, a switching circuitry, comparator circuits, encoder circuitries, and a control logic circuit. The capacitor array circuit generates a first signal according to an input signal and switching signals. The switching circuitry generates the switching signals according to an enable signal and a first valid signal in the valid signals. Each of the comparator circuits compares the first signal with a predetermined voltage, in order to generate a corresponding one of the valid signals. Each of the encoder circuitries receives the switching signals according to a corresponding one of the valid signals, in order to generate a corresponding one of sets of first digital codes. The control logic circuit performs a statistics calculation according to the sets of first digital codes, in order to generate a second digital code.

20 Claims, 4 Drawing Sheets

(56) References Cited

OTHER PUBLICATIONS

M. Ahmadi and W. Namgoong, "Comparator Power Reduction in Low-Frequency SAR ADC Using Optimized Vote Allocation," in IEEE Transactions on Very Large Scale Integration (VLSI) Systems, vol. 23, No. 11, pp. 2384-2394, Nov. 2015, doi: 10.1109/TVLSI.2014.2362545.

B. Verbruggen, J. Tsouhlarakis, T. Yamamoto, M. Iriguchi, E. Martens and J. Craninckx, "A 60 dB SNDR 35 MS/s SAR ADC With Comparator-Noise-Based Stochastic Residue Estimation," in IEEE Journal of Solid-State Circuits, vol. 50, No. 9, pp. 2002-2011, Sep. 2015, doi: 10.1109/JSSC.2015.2422781.

OA letter of the counterpart TW application (appl. No. 109112861) dated Jan. 5, 2021. Summary of the OA letter: 1.Claims 1-6 and 10 are rejected as allegedly being unpatentable over cited reference (WO 2017/058874 A1). 2.Claims 7-9 are allowable.

\* cited by examiner

DIGITAL SLOPE ANALOG TO DIGITAL CONVERTER DEVICE AND SIGNAL CONVERSION METHOD

BACKGROUND OF THE INVENTION

1. Field of the Invention

The present disclosure relates to an analog to digital converter. More particularly, the present disclosure relates to an analog to digital converter that utilizes multiple comparators and a signal conversion method thereof.

2. Description of Related Art

An analog to digital converter has been widely utilized in various electronic devices, in order to generate a digital signal for subsequent signal processing. In practical applications, there is trade-off between a performance (e.g., resolution, low noise, bandwidth, etc.) of the analog to digital converter and power consumption. However, the present circuit architecture of the analog to digital converter is insufficient to meet restrict requirements of high performance and low power consumption.

SUMMARY OF THE INVENTION

In some embodiments, a digital slope analog to digital converter device includes a capacitor array circuit, a switching circuitry, a plurality of comparator circuits, a plurality of encoder circuitries, and a control logic circuit. The capacitor array circuit us configured to generate a first signal according to an input signal and a plurality of switching signals. The switching circuitry is configured to generate the plurality of switching signals according to an enable signal and a first valid signal in a plurality of valid signals. Each of the plurality of comparator circuits is configured to compare the first signal with a predetermined voltage, in order to generate a corresponding one of the plurality of valid signals. Each of the plurality of encoder circuitries is configured to receive the plurality of switching signals according to a corresponding one of the plurality of valid signals, in order to generate a corresponding one of a plurality of sets of first digital codes. The control logic circuit is configured to perform a statistics calculation according to the plurality of sets of first digital codes, in order to generate a second digital code.

In some embodiments, a signal conversion method includes the following operations: generating a first signal according to an input signal and a plurality of switching signals; generating the plurality of switching signals according to an enable signal and a first valid signal in a plurality of valid signals; generating, by a plurality of comparator circuits, the plurality of valid signals, wherein each of the plurality of comparator circuits is configured to compare the first signal with a predetermined voltage, in order to generate a corresponding one of the plurality of valid signals; generating, by a plurality of encoder circuitries, a plurality of sets of first digital codes according to the plurality of valid signals; and performing a statistics calculation according to the plurality of sets of first digital codes, in order to generate a second digital code.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may be a system formed with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
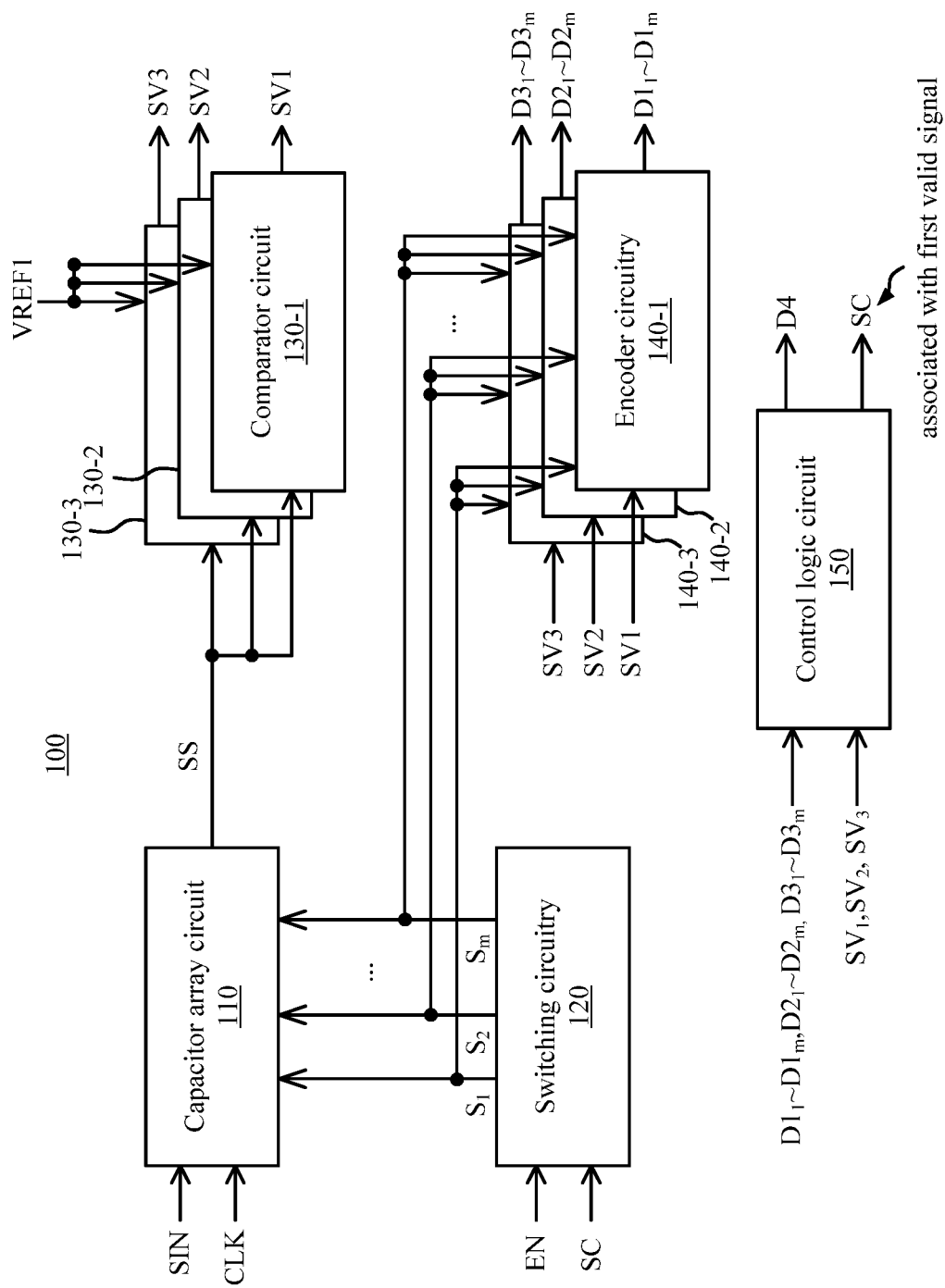
FIG. 1 is a schematic diagram of a digital slope analog to digital converter device according to some embodiments of the present disclosure.

FIG. 1 is a schematic diagram of a digital slope analog to digital converter (ADC) device 100 according to some embodiments of the present disclosure. In some embodiments, the digital slope ADC device 100 may convert an input signal SIN to a corresponding digital code D4.

The digital slope ADC device 100 includes a capacitor array circuit 110, a switching circuitry 120, comparator circuits 130-1, 130-2, and 130-3, encoder circuitries 140-1, 140-2, and 140-3, and a control logic circuit 150. The capacitor array circuit 110 generates a signal SS according to the input signal SIN and switching signals $S_1$-$S_m$. In some embodiments, the capacitor array circuit 110 sequentially adjusts (e.g., increase or decrease) a level of the signal SS (i.e., adjust a slope of the signal SS) based on a control of digital circuit(s) (which may be, for example, delay units $DU_1$-$DU_{m-1}$ and inverter circuits $I_1$-$I_2$ as discussed below).

The switching circuitry 120 generates the switching signals $S_1$-$S_m$ according to an enable signal EN and a first valid signal of valid signals SV1-SV3. For example, a signal SC is generated according to the first valid signal of the valid signals SV1-SV3, in which the first valid signal is for controlling the digital slope ADC device 100 to finish performing the analog to digital conversion. The switching circuitry 120 generates the switching signals $S_1$-$S_m$ in response to the enable signal EN and the signal SC. In some embodiments, the first valid signal may be a signal having a latest transition (e.g., signal level is changed) in the valid signals SV1-SV3 during an analog to digital conversion phase. In some embodiments, the first valid signal is a signal having the latest transition after the enable signal EN is switched from a first logic value (e.g., a logic value of 0) to a second logic value (e.g., a logic value of 1). Descriptions regarding herein will be given with reference to FIG. 4.

Each of the comparator circuits 130-1, 130-2, and 130-3 is configured to compare the signal SS with a predetermined voltage VREF1 (which may be, but not limited to, an AC ground voltage), in order to generate a corresponding one of the valid signal SV1-SV3. Taking the comparator circuit 130-1 as an example, an input terminal of the comparator circuit 130-1 is coupled to the capacitor array circuit 110 to receive the signal SS, and another one input terminal of the comparator circuit 130-1 receives the predetermined voltage VREF1. As a result, the comparator circuit 130-1 is able to compare the signal SS with the predetermined voltage VREF1, in order to measure these two voltages. If polarities on two input terminals of the comparator circuit 130-1 (or a polarity on an output terminal of the comparator circuit 130-1) are changed, it indicates that the signal SS transits to its zero crossing point, and thus the comparator circuit 130 outputs the valid signal SV1. With this analogy, it should be understood that the comparator circuit 130-2 compares the signal SS with the predetermined voltage VREF1 to output the valid signal SV2, and the comparator circuit 130-3 compares the signal SS with the predetermined voltage VREF1 to output the valid signal SV3. In some embodiments, the comparator circuits 130-1, 130-2, and 130-3 respectively generate the valid signals SV1-SV3 without calibrating DC offset voltage(s).

Each of the encoder circuitries 140-1, 140-2, and 140-3 is configured to generate a corresponding one of sets of digital codes $D1_1$-$D1_m$, $D2_1$-$D2_m$, and $D3_1$-$D3_m$ according to a corresponding one of the valid signals SV1-SV3. Taking the encoder circuitry 140-1 as an example, the encoder circuitry 140-1 receives the valid signal SV1, and generates the set of digital codes $D1_1$-$D1_m$. With this analogy, the encoder circuitry 140-2 generates the set of digital codes $D2_1$-$D2_m$ according to the valid signal SV2. The encoder circuitry 140-3 generates the set of digital codes $D3_1$-$D3_m$ according to the valid signal SV3.

The control logic circuit 150 is coupled to the encoder circuitries 140-1, 140-2, and 140-3, in order to receive the sets of digital codes $D1_1$-$D1_m$, $D2_1$-$D2_m$, and $D3_1$-$D3_m$. The control logic circuit 150 performs a statistics calculation according to the sets of digital codes $D1_1$-$D1_m$, $D2_1$-$D2_m$, and $D3_1$-$D3_m$, in order to generate the digital code D4. In some embodiments, the statistics calculation may be a majority vote operation, an averaging calculation, a weighted calculation, etc. For example, the control logic circuit 150 may average the sets of digital codes $D1_1$-$D1_m$, $D2_1$-$D2_m$, and $D3_1$-$D3_m$, in order to generate the digital code D4. With the consideration of the sets of digital codes $D1_1$-$D1_m$, $D2_1$-$D2_m$, and $D3_1$-$D3_m$, impacts from noises (e.g., quantization noise, circuit noise, etc) caused in the analog to digital conversion phase can be reduced, in order to generate more accurate digital code D4.

In some related approaches, an ADC device utilizes a single converter circuit to perform multiple analog to digital conversions on the same sampled signal, in order to generate multiple sets of digital codes. In these approaches, as the multiple analog to digital conversions are required, the operating speed is significantly decreased and is thus not suitable for requirements of present applications. In some other approaches, in order to increase the operating speed, the ADC device utilizes multiple converter circuits to simultaneously perform multiple analog to digital conversions on the same sampled signal, in order to generate the multiple sets of digital codes. However, as the multiple converter circuits are utilized, circuit area and the power consumption are significantly increased. Moreover, in these approaches, an additional mechanism is required to calibrate DC offset voltages in discrete-time comparators in the multiple converter circuits, in order to generate the multiple sets of digital codes having the appropriate linearity. As a result, this additional mechanism also causes bigger circuit area and higher power consumption.

Compared with the above approaches, in some embodiments of the present disclosure, the comparator circuits 130-1, 130-2, and 130-3, and the encoder circuitries 140-1, 140-2, and 140-3 are able to share the capacitor array circuit 110 and the switching circuitry 120. As a result, with a certain operating speed, the increment of the circuit area and that of the power consumption can be lower. Moreover, as the analog to digital conversion of the digital slope ADC device 100 is performed by utilizing the continuous-time comparator circuits 130-1, 130-2, and 130-3 to detect the zero crossing point, the sets of digital codes having the appropriate linearity can be generated without calibrating the DC offset voltage(s). In other words, in some embodiments, the digital slope ADC device 100 is able to perform the analog to digital conversion without utilizing the additional mechanism for calibrating the DC offset voltage(s). As a result, the circuit area and the power consumption can be further saved.

Figure 2:
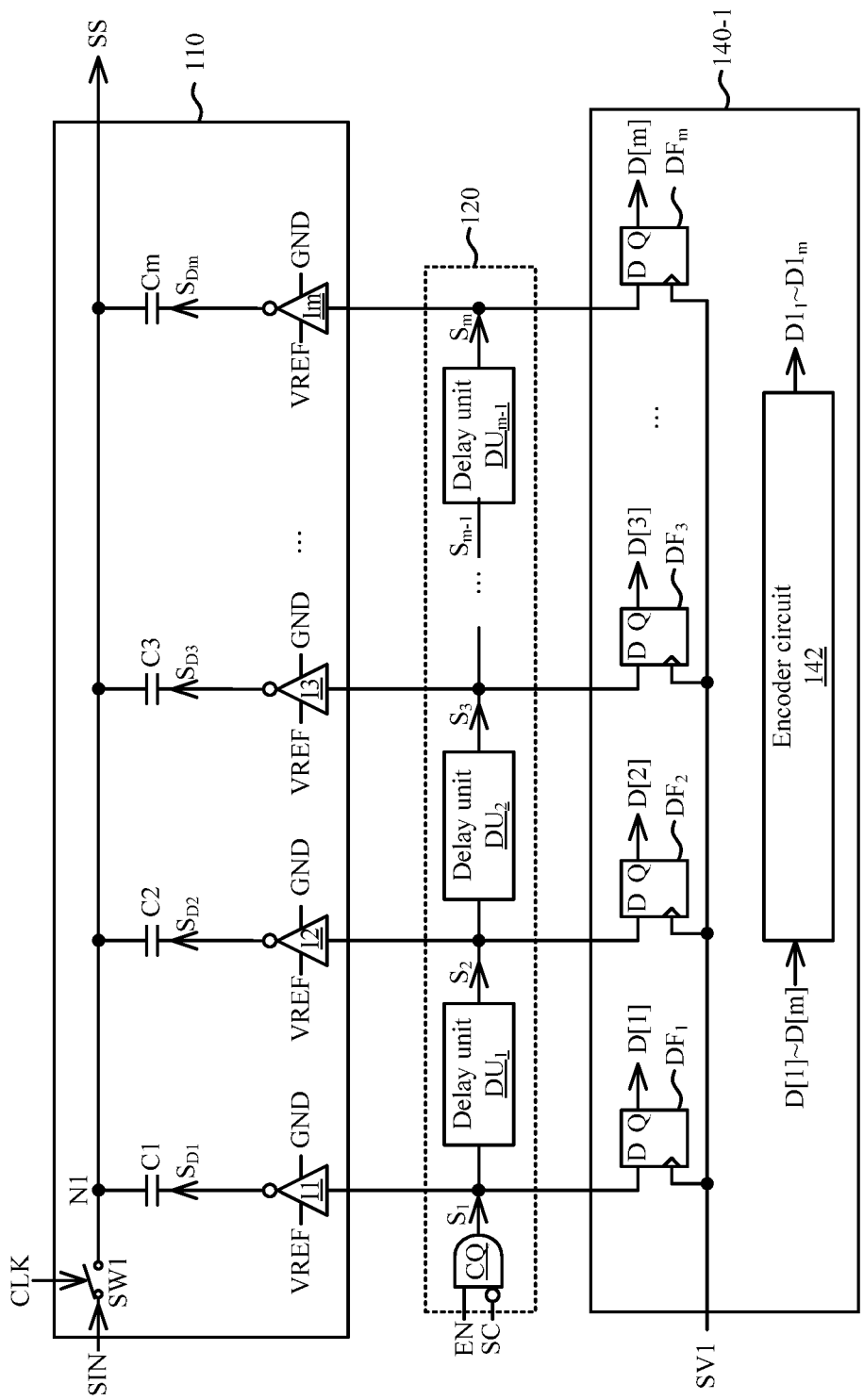
FIG. 2 is a schematic diagram of the capacitor array circuit, the switching circuitry, and the encoder circuitry according to some embodiments of the present disclosure.

FIG. 2 is a schematic diagram of the capacitor array circuit 110, the switching circuitry 120, and the encoder circuitry 140-1 according to some embodiments of the present disclosure. The capacitor array circuit 110 includes capacitors C1-Cm, inverter circuits I1-Im, and a switch SW1. A first terminal of the switch SW1 is configured to receive the input signal SIN, and a second terminal of the switch SW1 is coupled first terminals of the capacitors C1-Cm. The switch SW1 is turned on according to a clock signal CLK, in order to transmit the input signal SIN to the capacitors C1-Cm.

Second terminals of the capacitors C1-Cm respectively receive control signals $S_{D1}$-$S_{Dm}$. Each of the inverter circuits I1-Im generates a corresponding one of the control signals $S_{D1}$-$S_{Dm}$ according to a corresponding one of the switching signals $S_1$-$S_m$. Taking the inverter circuit I1 as an example, the inverter circuit I1 outputs the control signal $S_{D1}$ to the second terminal of the capacitor C1 according to the switching signal $S_1$. With this analogy, the corresponding arrangements among the switching signals $S_2$-$S_m$, the control signals $S_{D1}$-$S_{Dm}$, the inverter circuits I2-Im, and the capacitors C2-Cm can be understood.

The inverter circuits I1-Im receive a reference voltage VREF and a ground voltage GND, in order to set a high level and a low level of the control signals $S_{D1}$-$S_{Dm}$, in which the reference voltage VREF is higher than the ground voltage GND. For example, if the switching signal $S_1$ has the logic value of 0 (i.e., has the low level), the inverter circuit I1 outputs the control signal $S_{D1}$ having the logic value of 1 (i.e. having the level of the reference voltage VREF). Alternatively, if the switching signal $S_1$ has the logic value of 1 (i.e., has the high level), the inverter circuit I1 outputs the control signal $S_{D1}$ has the logic value of 0 (i.e., has the level of the ground voltage GND). Before the analog to digital conversion is performed, the enable signal EN is set to have the logic value of 0, and thus the control signals $S_{D1}$-$S_{Dm}$ have the level of the reference voltage VREF. As a result, levels of the first terminals of the capacitors C1-Cm are shifted to a high level, in order to ensure that an initial level of the signal SS is within a proper working range of the digital slope ADC device 100.

The switching circuitry 120 includes a logic gate circuit CQ and delay units $DU_1$-$DU_{m-1}$. The logic gate circuit CQ is configured to generate the switching signal $S_1$ has a first logic value (e.g., the logic value of 1) when the enable signal EN has the first logic value and the signal SC (or the first valid signal) has a second logic value (e.g., the logic of 0), in which the first logic value is different from the second logic value. For example, the logic gate circuit CQ may be an AND gate having a non-inverting input terminal and an inverting input terminal. The non-inverting input terminal receives the enable signal EN, and the inverting input terminal receives the signal SC (or a signal associated with the first valid signal). As a result, when the enable signal EN has the logic value of 1 and the signal SC has the logic value of 0, the logic gate circuit CQ outputs the switching signal $S_1$ having the logic value of 1.

The delay units $DU_1$-$DU_{m-1}$ are coupled in series, in order to delay the switching signal $S_1$ to sequentially generate the remaining switching signals $S_2$-$S_m$. The delay unit $DU_1$ generates the switching signal $S_2$ according to the switching signal $S_1$. With this analogy, the delay unit $DU_{m-1}$ generates the switching signal $S_m$ according to a switching signal $S_{m-1}$ (not shown). In some embodiments, each of the delay units $DU_1$-$DU_{m-1}$ may be implemented with logic gate circuits (e.g., AND gates, inverters, or the like) that are coupled in series, in order to delay the received switching signal by a predetermined delay time to generate a next switching signal.

The encoder circuitry 140-1 includes flip-flop circuits $DF_1$-$DF_m$ and an encoder circuit 142. The flip-flop circuits $DF_1$-$DF_m$ are configured to respectively receive the switching signals $S_1$-$S_m$ according to the valid signal SV1, in order to output signals D[1]-D[m]. The encoder circuit 142 encodes the signals D[1]-[m], in order to generate the set of digital codes $D1_1$-$D1_m$. In some embodiments, the signals D[1]-[m] may be thermometer code, and the digital codes $D1_1$-$D1_m$ may be binary code. In some embodiments, the encoder circuitries 140-1, 140-2, and 140-3 have the same circuit architecture. For example, in the encoder circuitry 140-2, the flip-flop circuits $DF_1$-$DF_m$ respectively receive the switching signals $S_1$-$S_m$ according to the valid signal SV2, in order to provide signals to the encoder circuit 142 to generate the set of digital codes $D2_1$-$D2_m$. Similarly, in the encoder circuitry 140-3, the flip-flop circuits $DF_1$-$DF_m$ respectively receive the switching signals $S_1$-$S_m$ according to the valid signal SV3, in order to provide signals to the encoder circuit 142 to generate the set of digital codes $D3_1$-$D3_m$.

The above circuit arrangements and various numbers of the circuit components/signals/bits are given for illustrative purposes, and the present disclosure is not limited thereto.

For example, in some embodiments, the encoder circuitry 140-1 may include more flip-flop circuits (not shown). These flip-flop circuits may receive signals associated with the switching signals from the delay units $DU_1$-$DU_{m-1}$ according to the valid signal SV1, in order to generate more bits to the encoder circuit 142. As a result, the encoder circuit 142 may generate the set of digital codes $D1_1$-$D1_m$ that is more accurate according to information containing more bits.

Figure 3:
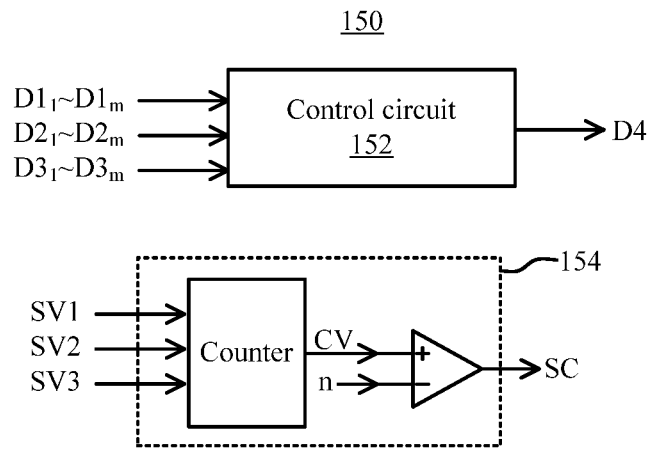
FIG. 3 is a schematic diagram of the control logic circuit in FIG. 1 according to some embodiments of the present disclosure.

FIG. 3 is a schematic diagram of the control logic circuit 150 in FIG. 1 according to some embodiments of the present disclosure. In some embodiments, the control logic circuit 150 is configured to generate a count value CV according to the valid signals SV1-SV3, and to output the signal SC when the count value equals a predetermined n. For example, the control logic circuit 150 includes a control circuit 152 and a counter circuit 154. The control circuit 152 is configured to perform the statistics calculation on the sets of digital codes $D1_1$-$D1_m$, $D2_1$-$D2_m$, and $D3_1$-$D3_m$, in order to generate a digital code D4. In some embodiments, the control circuit 152 may be implemented with at least one digital logic circuit having a computing ability. The counter circuit 154 is configured to receive the valid signals SV1, SV2, and SV3, and to count according to the valid signal SV1, SV2, and SV3 to generate the count value CV, and to output the signal SC when the count value CV equals the predetermined value n.

In some embodiments, the predetermined value n may be set to be a number of the comparator circuits 130-1, 130-2, and 130-3 (in this example, the predetermined value n is 3). The counter circuit 154 may be an up counter circuit, and is triggered by the valid signal SV1, SV2, or SV3 having the logic value of 1 to increase the count value CV. When the count value CV is less than the predetermined value n, the counter circuit 154 outputs the signal SC having the logic value of 0. In response to the signal SC, the switching circuitry 120 continuously updates the switching signals $S_1$-$S_m$, in order to continuously perform the analog to digital conversion. When the count value CV equals the predetermined value n, the counter circuit 154 outputs the signal SC having the logic value of 1. In response to the signal SC, the switching circuitry 120 resets the switching signals $S_1$-$S_m$, in order to finish performing the analog to digital conversion and to enter a next sampling phase.

Figure 4:
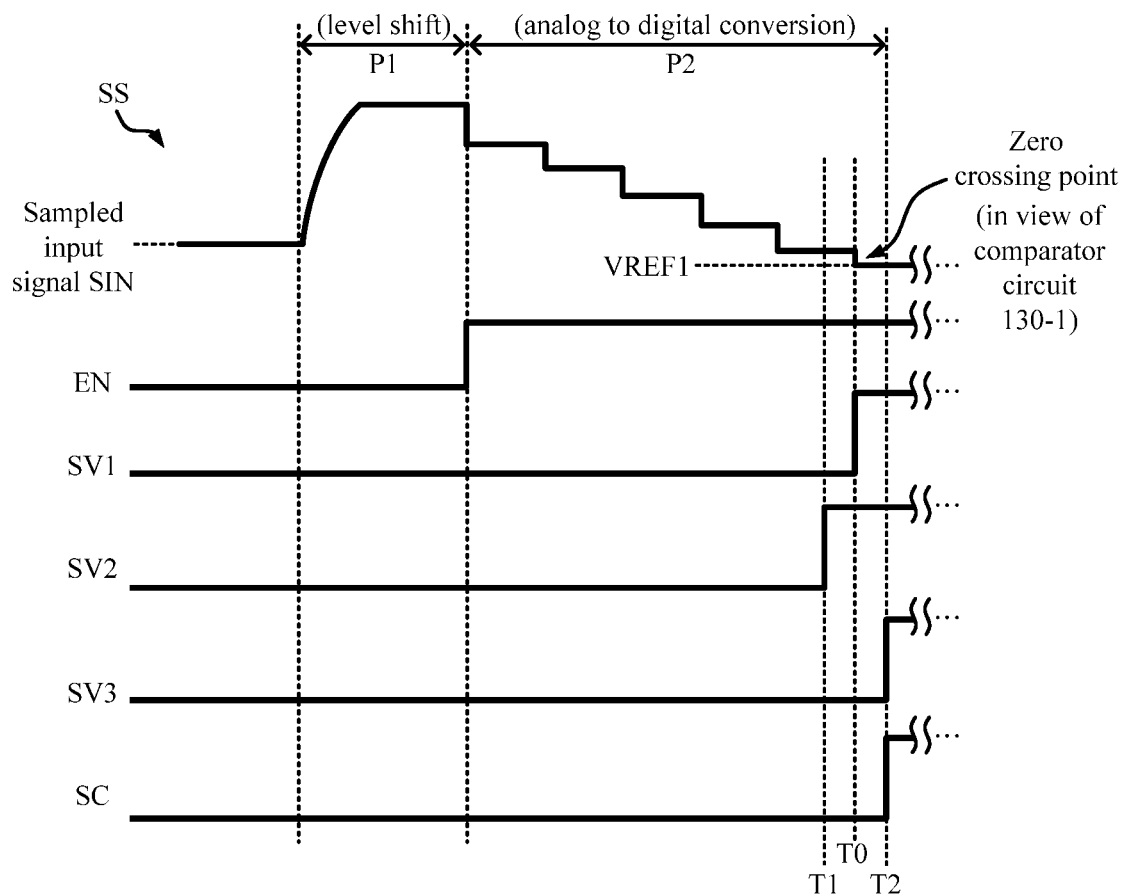
FIG. 4 is a waveform diagram of partial waveforms in FIG. 1 according to some embodiments of the present disclosure.

FIG. 4 is a waveform diagram of partial waveforms in FIG. 1 according to some embodiments of the present disclosure. Prior to a time interval P1, both of the enable signal EN and the signal SC have the logic values of 0 (i.e., the low level). Under this condition, the switching signals $S_1$-$S_m$ have the logic values of 0, and thus the control signals $S_{D1}$-$S_{Dm}$ have the level of the reference voltage VREF. As a result, the capacitor array circuit 110 is reset, in order to sample the input signal SIN. During the time interval P1, the signal SS is shifted to a proper level by an additional circuit (not shown). In some embodiments, the proper level may be a level within a full scale range of the digital slope ADC device 100.

During a time interval P2, the enable signal EN has the logic value of 1 (i.e., the high level) and the signal SC has the logic value of 0. Under this condition, the digital slope ADC device 100 starts performing the analog to digital conversion. In response to the enable signal EN, the switching signals $S_1$-$S_m$ are sequentially switched from the logic value of 0 to the logic value of 1. Taking the switching signal $S_1$ as an example, when the switching signal $S_1$ is switched from the logic value of 0 to the logic value of 1, the control signal $S_{D1}$ is switched to the level of the ground voltage GND. As a result, the level of the signal SS is pulled down by the capacitor C1. With operations of the delay units $DU_1$-$DU_{m-1}$, the switching signals $S_2$-$S_m$ are sequentially switched to the logic value of 1, and thus the level of the signal SS is sequentially pulled down by the capacitors C2-Cm.

The comparator circuit 130-1 detects that the level of the signal SS is less than the predetermined voltage VREF1 (i.e., the zero crossing point is occurred) at time T0, and thus outputs the valid signal SV1 of the logic value of 1. In response to this valid signal SV1, the count value CV in FIG. 3 is increased by one. On account of impacts from noises, the comparator circuit 130-2 detects that the level of the signal SS is less than the predetermined voltage VREF at time T1 (which is earlier than time T0), and thus outputs the valid signal SV having the logic value of 1. In response to this valid signal SV2, the count value in FIG. 3 is increased by one. Similarly, the comparator circuit 130-3 detects that the level of the signal SS is less than the predetermined voltage VREF1 at time T2 (which is later than time T0), and thus outputs the valid signal SV3 having the logic value of 1. In response to this valid signal SV3, the count value is increased by one again. Accordingly, at time T2, the count value is three and equals the predetermined value n, and thus the control logic circuit 150 outputs the signal SC having the logic value of 1. In response to this signal SC, the encoder circuitries 140-1, 140-2, and 140-3 respectively generate the sets of digital codes $D1_1$-$D1_m$, $D2_1$-$D2_m$, and $D3_1$-$D3_m$. As a result, the control logic circuit 150 generates the digital code D4 according to the sets of digital codes $D1_1$-$D1_m$, $D2_1$-$D2_m$, and $D3_1$-$D3_m$.

In this example, the valid signal SV3 is the aforementioned first valid signal. For example, after the enable signal EN is switched from the logic value of 0 to the logic value of 1 (i.e., after entering the analog to digital conversion phase), the valid signal SV3 is the signal having the latest transition in the valid signals SV1-SV3. By utilizing the valid signal SV3 to control the end of the analog to digital conversion, it ensures that a changing of the level of the signal SS is sufficient for each of the comparator circuits 130-1, 130-2, and 130-3 to detect the zero crossing point. As a result, the sets of digital codes $D1_1$-$D1_m$, $D2_1$-$D2_m$, and $D3_1$-$D3_m$ are sufficient to indicate impacts from noises on the comparator circuits 130-1, 130-2, and 130-3. With the statics calculation, the control logic circuit 150 is able to average (i.e., reduce) the impacts from noises, in order to generate more accurate digital code D4.

In some embodiments, in the example of FIG. 4, the valid signal SV2 can be the first valid signal in the valid signals SV1-SV3. Under this condition, as the comparator circuit 130-3 has not detected the zero crossing point, the corresponding set of digital codes $D3_1$-$D3_m$ may be inaccurate. Accordingly, the control logic circuit 150 may only average the sets of digital codes $D1_1$-$D1_m$ and $D2_1$-$D2_m$ to generate the digital code D4.

The above descriptions are given with examples using three encoder circuitries (i.e., the predetermined value n is 3) and three comparator circuits for illustrative purposes, but the present disclosure is not limited thereto. In various embodiments, the number of the encoder circuitries may be equal to or greater than 2, and the number of the comparator circuits may be equal to or greater than 2.

The above embodiments are given with examples using single-ended circuits for illustrative purposes, but the present disclosure is not limited thereto. It should be understood that the above embodiments can be implemented with differential circuits (e.g., two capacitor array circuits 110 are utilized to sample a differential input signal to generate two signals to the comparator circuit).

Figure 5:
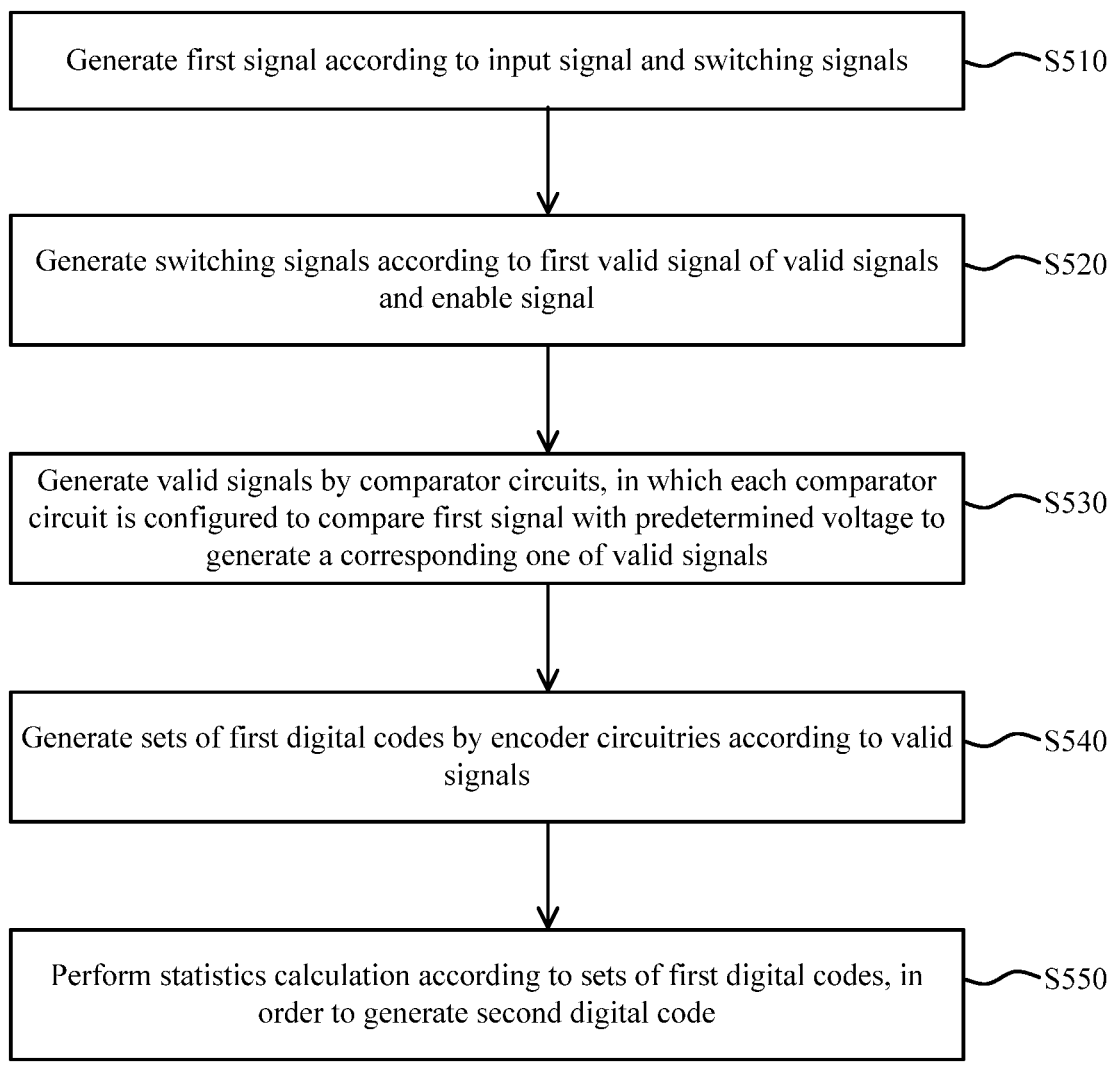
FIG. 5 is a flow chart of a signal conversion method according to some embodiments of the present disclosure.

FIG. 5 is a flow chart of a signal conversion method 500 according to some embodiments of the present disclosure. In some embodiments, the signal conversion method 500 may be, but not limited to, performed by the digital slope ADC device 100 in FIG. 1.

In operation S510, a first signal is generated according to the input signal and the switching signals. In operation S520, the switching signals are generated according to the first valid signal in the valid signals and the enable signal. In operation S530, the valid signals are generated by the comparator circuits, in which each of the comparator circuits compares the first signal with the predetermined voltage to generate a corresponding one of the valid signals. In operation S540, sets of first digital codes are generated by encoder circuitries according to the valid signals. In operation S550, a statistics calculation is performed according to the sets of first digital codes, in order to generate a second digital code.

Operations in the signal conversion method 500 can be understood with reference to the above embodiments, and thus the repetitious descriptions are not given herein. The above description of the signal conversion method 500 includes exemplary operations, but the operations of the signal conversion method 500 are not necessarily performed in the order described above. Operations of the signal conversion method 500 can be added, replaced, changed order, and/or eliminated, or the operations of the signal conversion method 500 can be executed simultaneously or partially simultaneously as appropriate, in accordance with the spirit and scope of various embodiments of the present disclosure.

As described above, the digital slope ADC device and the signal conversion method, provided in some embodiments, utilize comparator circuits that share one capacitor array circuit to perform the analog to digital conversion. As a result, the resolution of the ADC device can be improved while keeping lower circuit area and lower power consumption.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A digital slope analog to digital converter device, comprising:
   a capacitor array circuit configured to generate a first signal according to an input signal and a plurality of switching signals;
   a switching circuitry configured to generate the plurality of switching signals according to an enable signal and a first valid signal in a plurality of valid signals;
   a plurality of comparator circuits, wherein each of the plurality of comparator circuits is configured to compare the first signal with a predetermined voltage, in order to generate a corresponding one of the plurality of valid signals;
   a plurality of encoder circuitries, wherein each of the plurality of encoder circuitries is configured to receive the plurality of switching signals according to a corresponding one of the plurality of valid signals, in order to generate a corresponding one of a plurality of sets of first digital codes; and
   a control logic circuit configured to perform a statistics calculation according to the plurality of sets of first digital codes, in order to generate a second digital code.

2. The digital slope analog to digital converter device of claim 1, wherein each of the plurality of comparator circuits generates the corresponding one of the plurality of valid signals without calibrating a DC offset voltage.

3. The digital slope analog to digital converter device of claim 1, wherein the first valid signal is a signal having a latest transition in the plurality of valid signals after the enable signal is switched from a first logic value to a second logic value.

4. The digital slope analog to digital converter device of claim 1, wherein the switching circuitry is configured to generate a first switching signal in the plurality of switching signals according to the enable signal and the first valid signal, and is configured to sequentially delay the first switching signal to generate remaining switching signals of the plurality of switching signals.

5. The digital slope analog to digital converter device of claim 4, wherein the switching circuitry comprises:
   a first logic gate circuit configured to generate the first switching signal having a first logic value when the enable signal has the first logic value and the first valid signal has a second logic value, wherein the first logic value is different from the second logic value; and
   a plurality of delay units coupled in series to delay the first switching signal, in order to sequentially generate the remaining switching signals.

6. The digital slope analog to digital converter device of claim 5, wherein the first logic gate circuit comprises a non-inverting input terminal and an inverting input terminal, the non-inverting input terminal is configured to receive the enable signal, and the inverting input terminal is configured to receive a signal associated with the first valid signal.

7. The digital slope analog to digital converter device of claim 5, wherein the first logic gate circuit is a AND gate circuit.

8. The digital slope analog to digital converter device of claim 1, wherein the capacitor array circuit comprises:
   a plurality of inverter circuits, wherein each of the plurality of inverter circuits is configured to generate a corresponding one of a plurality of control signals according to a corresponding one of the plurality of switching signals; and
   a plurality of capacitors, wherein first terminals of the plurality of capacitors are configured to receive the input signal, and second terminals of the plurality of capacitors are configured to respectively receive the plurality of control signals.

9. The digital slope analog to digital converter device of claim 1, wherein each of the encoder circuitries comprises:
   a plurality of flip-flop circuits configured to respectively receive the plurality of switching signals according to a corresponding one of the plurality of valid signals, in order to output a plurality of second signals; and
   an encoder circuit configured to encode the plurality of second signals to generate a corresponding one of the plurality of sets of first digital codes.

10. The digital slope analog to digital converter device of claim 1, wherein the control logic circuit is configured to average the plurality of sets of first digital codes, in order to generate the second digital code.

11. The digital slope analog to digital converter device of claim 1, wherein the control logic circuit is configured to count according to the plurality of valid signals to generate a count value, and to output a third signal when the count value equals a predetermined value, and the switching circuitry is further configured to generate the plurality of switching signals according to the third signal and the enable signal.

12. The digital slope analog to digital converter device of claim 11, wherein the predetermined value is a number of the plurality of comparator circuits.

13. A signal conversion method, comprising:
   generating a first signal according to an input signal and a plurality of switching signals;
   generating the plurality of switching signals according to an enable signal and a first valid signal in a plurality of valid signals;
   generating, by a plurality of comparator circuits, the plurality of valid signals, wherein each of the plurality of comparator circuits is configured to compare the first signal with a predetermined voltage, in order to generate a corresponding one of the plurality of valid signals;
   generating, by a plurality of encoder circuitries, a plurality of sets of first digital codes according to the plurality of valid signals; and
   performing a statistics calculation according to the plurality of sets of first digital codes, in order to generate a second digital code.

14. The signal conversion method of claim 13, wherein each of the plurality of comparator circuits generates the corresponding one of the plurality of valid signals without calibrating a DC offset voltage.

15. The signal conversion method of claim 13, wherein the first valid signal is a signal having a latest transition in the plurality of valid signals after the enable signal is switched from a first logic value to a second logic value.

16. The signal conversion method of claim 13, wherein the statistics calculation is an averaging calculation.

17. The signal conversion method of claim 13, wherein generating the plurality of switching signals according the first valid signal and the enable signal comprises:
   counting according to the plurality of valid signals to generate a count value;
   outputting a third signal when the count value equals a predetermined value;
   generating a first switching signal in the plurality of switching signals according to the third signal and the enable signal; and sequentially delaying the first switching signal, in order to generate remaining switching signals of the plurality of switching signals.

18. The signal conversion method of claim 17, wherein the predetermined value is a number of the plurality of comparator circuits.

19. The signal conversion method of claim 13, wherein generating the first signal according to the input signal and the plurality of switching signals comprises:

transmitting the input signal to first terminals of a plurality of capacitors; and generating a plurality of control signals according to the plurality of switching signals, and transmitting the plurality of control signals to second terminals of the plurality of capacitors, in order to generate the first signal.

20. The signal conversion method of claim 13, wherein generating the sets of first digital codes according to the plurality of valid signals comprises:

respectively receiving the plurality of switching signals according to a corresponding one of the plurality of valid signals, in order to output a plurality of second signals; and encoding the plurality of second signals, in order to generate a corresponding one of the sets of first digital codes.

* * * * *